(12) United States Patent
Ikeda et al.

(10) Patent No.: US 10,295,609 B2
(45) Date of Patent: May 21, 2019

(54) DETERIORATION STATE DETECTION APPARATUS AND DETERIORATION STATE DETECTION METHOD FOR ENERGY STORAGE DEVICE, AND ENERGY STORAGE SYSTEM

(71) Applicant: GS Yuasa International Ltd., Kyoto-shi, Kyoto (JP)

(72) Inventors: Yuichi Ikeda, Kyoto (JP); Yohei Tao, Kyoto (JP); Shigeki Yamate, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 547 days.

(21) Appl. No.: 14/905,137

(22) PCT Filed: Jun. 18, 2014

(86) PCT No.: PCT/JP2014/003274
§ 371 (c)(1),
(2) Date: Jan. 14, 2016

(87) PCT Pub. No.: WO2015/011872
PCT Pub. Date: Jan. 29, 2015

(65) Prior Publication Data
US 2016/0195588 A1    Jul. 7, 2016

(30) Foreign Application Priority Data
Jul. 23, 2013    (JP) .................................. 2013-152828

(51) Int. Cl.
*G01R 31/36*    (2019.01)
*H01M 10/42*    (2006.01)
(Continued)

(52) U.S. Cl.
CPC ........... *G01R 31/392* (2019.01); *G01R 31/36* (2013.01); *G01R 31/3648* (2013.01);
(Continued)

(58) Field of Classification Search
CPC ................ G01R 31/3679; G01R 31/36; G01R 31/3648; G01R 31/3662; H01M 10/4257;
(Continued)

(56) References Cited

U.S. PATENT DOCUMENTS

| | | |
|---|---|---|
| 6,924,623 B2 | 8/2005 | Takashi |
| 7,030,618 B2 | 4/2006 | Takashi |

(Continued)

FOREIGN PATENT DOCUMENTS

| | | |
|---|---|---|
| JP | 59154383 A2 | 9/1984 |
| JP | 2000299137 A2 | 10/2000 |

(Continued)

OTHER PUBLICATIONS

Kobayashi; Translation of Japanese Patent Document JP 2012220199 A; dated Nov. 12, 2012; EPO and Google.*

(Continued)

*Primary Examiner* — Melissa J Koval
*Assistant Examiner* — Rahul Maini
(74) *Attorney, Agent, or Firm* — Rankin, Hill & Clark LLP

(57) ABSTRACT

A deterioration state detection apparatus for detecting a deterioration state of capacity enabling charge or discharge of a nonaqueous electrolyte secondary battery includes: an acquisition unit that acquires a capacitance of the nonaqueous electrolyte secondary battery: and a determination unit that determines the deterioration state of capacity enabling charge or discharge of the nonaqueous electrolyte secondary battery, from change of the acquired capacitance.

13 Claims, 10 Drawing Sheets

(51) Int. Cl.
  *H01M 10/48* (2006.01)
  *G01R 31/392* (2019.01)
  *G01R 31/389* (2019.01)
  *H02J 7/00* (2006.01)
  *G01R 31/44* (2006.01)
  *H02J 7/04* (2006.01)

(52) U.S. Cl.
  CPC .......... *G01R 31/389* (2019.01); *G01R 31/44* (2013.01); *H01M 10/4257* (2013.01); *H01M 10/48* (2013.01); *H02J 7/00* (2013.01); *H01M 2010/4271* (2013.01); *H01M 2010/4278* (2013.01); *H01M 2220/30* (2013.01); *H02J 7/04* (2013.01)

(58) Field of Classification Search
  CPC ......... H01M 10/48; H01M 2010/4271; H01M 2010/7278; H01M 2220/30; H02J 7/00; H02J 7/04
  USPC ........................................... 324/430
  See application file for complete search history.

(56) References Cited

U.S. PATENT DOCUMENTS

| | | | |
|---|---|---|---|
| 7,075,305 B2 | 7/2006 | Takashi | |
| 7,180,298 B2 | 2/2007 | Takashi | |
| 7,235,326 B2 | 6/2007 | Takashi | |
| 8,886,478 B2 | 11/2014 | Fink | |
| 2001/0028238 A1 | 10/2001 | Takashi | |
| 2011/0018551 A1* | 1/2011 | Yamane | G01R 31/3679 324/548 |
| 2012/0161792 A1 | 6/2012 | Ikeda et al. | |
| 2012/0217922 A1 | 8/2012 | Sato | |
| 2015/0135517 A1* | 5/2015 | Doi | H01M 10/48 324/427 |
| 2015/0280481 A1 | 10/2015 | Ikeda et al. | |
| 2015/0293181 A1* | 10/2015 | Kaneno | G01R 31/3679 324/426 |

FOREIGN PATENT DOCUMENTS

| | | |
|---|---|---|
| JP | 2010124634 A2 | 6/2010 |
| JP | 2012-137341 | 7/2012 |
| JP | 2012173279 A1 | 9/2012 |
| JP | 2012524247 | 10/2012 |
| JP | 2012220199 A2 | 11/2012 |

OTHER PUBLICATIONS

Yokoyama; Translation of Japanese Patent Document JP 2010124634 A; dated Jun. 3, 2010; EPO and Google.*

International Search Report dated Sep. 22, 2014 filed in PCT/JP2014/003274.

* cited by examiner

| | IMPEDANCE | TOP FREQUENCY | CAPACITANCE |
|---|---|---|---|
| FIRST TIME POINT | Ra | fa | Ca |
| SECOND TIME POINT | Rb | fb | Cb |
| ⋮ | ⋮ | ⋮ | ⋮ |
| DETERMINATION TIME POINT | Rn | fn | Cn |

| NUMBER OF CYCLES | R [ohm] | f [Hz] | C [F] | Cav ×0.85 |
|---|---|---|---|---|
| 0 | 0.031 | (63.1) | (0.1) | — |
| 50 | 0.029 | 3.2 | 1.7 | 1.45 |
| 150 | 0.038 | 2.5 | 1.7 | 1.45 |
| 300 | 0.048 | 2.0 | 1.7 | 1.45 |
| 500 | 0.055 | 1.6 | 1.8 | 1.47 |
| 700 | 0.073 | 1.6 | 1.4 | — |
| 900 | 0.112 | 1.3 | 1.1 | — |

| NUMBER OF CYCLES | R [ohm] | f [Hz] | C [F] | Cav ×0.85 |
|---|---|---|---|---|
| 0 | 0.031 | (63.1) | (0.1) | — |
| 50 | 0.043 | 3.2 | 1.2 | 1.02 |
| 150 | 0.055 | 2.5 | 1.2 | 1.02 |
| 300 | 0.066 | 2.0 | 1.2 | 1.02 |
| 500 | 0.081 | 1.6 | 1.2 | 1.02 |
| 700 | 0.100 | 1.6 | 1.0 | — |
| 900 | 0.176 | 1.3 | 0.7 | — |

10,295,609 B2

DETERIORATION STATE DETECTION APPARATUS AND DETERIORATION STATE DETECTION METHOD FOR ENERGY STORAGE DEVICE, AND ENERGY STORAGE SYSTEM

TECHNICAL FIELD

The present invention relates to a deterioration state detection apparatus and deterioration state detection method for detecting a deterioration state of an energy storage device, and an energy storage system including an energy storage device and a deterioration state detection apparatus.

BACKGROUND ART

Energy storage devices such as lithium ion secondary batteries are used as power supplies of mobile apparatuses such as notebook computers and mobile phones, and the energy storage devices have recently become used as power supplies of electric vehicles in a wide range of fields. Herein, in order to achieve the long-term life of the energy storage device, it is necessary to grasp the deterioration state of the energy storage device, and use the energy storage device in accordance with the deterioration state.

Therefore, it is important to grasp the deterioration state of the energy storage device, and there is conventionally proposed a technology capable of determining the deterioration state of the energy storage device (e.g., refer to Patent Document 1). In this technology, the deterioration state of a secondary battery is determined. In a case where the secondary battery is deteriorated, the deteriorated secondary battery is regenerated.

PRIOR ART DOCUMENTS

Patent Documents

Patent Document 1: JP-A-2000-299137

SUMMARY OF THE INVENTION

Problems to be Solved by the Invention

However, the above conventional technology has a problem that rapid performance degradation of the energy storage device cannot be previously detected.

The present invention has been made in order to solve the above problem, and an object of the present invention is to provide a deterioration state detection apparatus, a deterioration state detection method, and an energy storage system capable of previously detecting the rapid performance degradation of an energy storage device.

Means for Solving the Problems

In order to achieve the above object, a deterioration state detection apparatus for an energy storage device according an aspect of the present invention is a deterioration state detection apparatus for detecting a deterioration state of an energy storage device, and includes: an acquisition unit that acquires a capacitance of the energy storage device; and a determination unit that determines the deterioration state of the energy storage device, from change of the acquired capacitance.

In addition to such a deterioration state detection apparatus for an energy storage system, the present invention can also be implemented as an energy storage system including an energy storage device and the deterioration state detection apparatus for detecting the deterioration state of the energy storage device. The present invention can be implemented also as a deterioration state detection method including characteristic processes performed by the deterioration state detection apparatus, as steps. The present invention can be implemented also as an integrated circuit including the characteristic processors included in the deterioration state detection apparatus. The present invention can be implemented also as a program causing a computer to execute characteristic processes including the deterioration state detection method, or a computer readable recording medium with the program recorded therein, such as a CD-ROM (Compact Disc-Read Only Memory). It goes without saying that such a program can be distributed through a transmission medium, for example, a recording medium such as a CD-ROM, the Internet, and the like.

Advantages of the Invention

According to the present invention, it is possible to previously detect rapid performance degradation in an energy storage device such as a lithium ion secondary battery.

Figure 1:
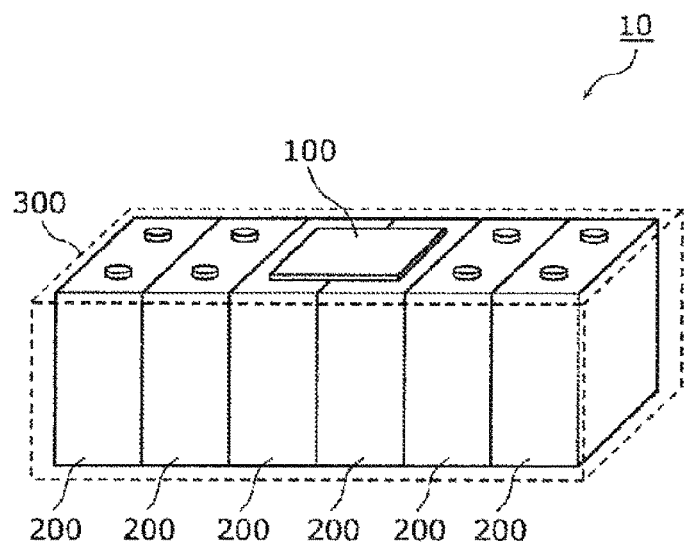
FIG. 1 is an external view of an energy storage system including a deterioration state detection apparatus according to an embodiment of the present invention.

MODE FOR CARRYING OUT THE INVENTION (Basic Findings of the Present Invention)

The above conventional technology has a problem that the rapid performance degradation of an energy storage device cannot be previously detected. That is, in a lithium ion secondary battery particularly used for a hybrid vehicle or an electric vehicle, since battery performance is rapidly degraded at the end of life, it is extremely important to previously detect the rapid degradation of the battery performance with high accuracy. However, in the conventional technology, the deterioration state of the secondary battery is merely determined, and the rapid performance degradation of the secondary battery cannot be previously detected.

The present invention has been made in order to solve the above problem, and an object of the present invention is to provide a deterioration state detection apparatus, a deterioration state detection method, and an energy storage system capable of previously detecting the rapid performance degradation of an energy storage device.

In order to achieve the above object, a deterioration state detection apparatus for an energy storage device according to an aspect of the present invention is a deterioration state detection apparatus for detecting a deterioration state of an energy storage device, and includes: an acquisition unit that acquires a capacitance of the energy storage device; and a determination unit that determines the deterioration state of the energy storage device, from change of the acquired capacitance.

Thus, the deterioration state detection apparatus determines the deterioration state of the energy storage device, from the change of the capacitance of the energy storage device. Herein, as a result of inventive studies and experiments, the inventors of the present application have found that it is possible to previously determine whether or not the rapid performance degradation of the energy storage device will be caused, from the change of the capacitance. Therefore, the deterioration state detection apparatus can previously detect the rapid performance degradation of the energy storage device.

The determination unit may determine whether or not a determination capacitance which is a capacitance calculated at a predetermined determination time point is smaller than a reference value, so that the determination unit may determine the deterioration state of the energy storage device at the determination time point.

Herein, as a result of inventive studies and experiments, the inventors of the present application have found that it is determined whether or not the capacitance calculated at the predetermined determination time point is smaller than the reference value, so that it is possible to previously determine at the determination time point whether or not the rapid performance degradation of the energy storage device will be caused. Therefore, the deterioration state detection apparatus can previously detect the rapid performance degradation of the energy storage device.

The determination unit may employ a value obtained by multiplying a capacitance average value being an average value of capacitances calculated before the determination time point by a predetermined constant, as the reference value, and determine whether or not the determination capacitance is smaller than the reference value, so that the determination unit may determine the deterioration state of the energy storage device at the determination time point.

Herein, as a result of inventive studies and experiments, the inventors of the present application have found that it is determined whether or not the determination capacitance is smaller than the value obtained by multiplying the average value of the capacitances calculated before the determination time point by the predetermined constant, so that it is possible to previously determine at the determination time point whether or not the rapid performance degradation of the energy storage device will be caused. Therefore, the deterioration state detection apparatus can previously detect the rapid performance degradation of the energy storage device.

The determination unit may employ a value between 0.8 and 0.9 as the constant, and determine whether or not the determination capacitance is smaller than the reference value, so that the determination unit may determine the deterioration state of the energy storage device at the determination time point.

Herein, as a result of inventive studies and experiments, the inventors of the present application have found that in a case where the determination capacitance is smaller than a value between 80% and 90% of the capacitance average value, it is possible to determine that the energy storage device is in a state that the rapid performance degradation of the energy storage device has not been caused. Therefore, the deterioration state detection apparatus can previously detect the rapid performance degradation of the energy storage device.

The acquisition unit may acquire capacitances of the energy storage device at a plurality of time points up to the determination time point, and the determination unit may average the plurality of capacitances acquired before the determination time point to calculate the capacitance average value, so that the determination unit may determine the deterioration state of the energy storage device at the determination time point.

Thus, the deterioration state detection apparatus acquires the capacitances at the plurality of time points up to the determination time point, calculates the capacitance average value, so that the deterioration state detection apparatus previously determines at the determination time point whether or not the rapid performance degradation of the energy storage device will be caused. Consequently, the deterioration state detection apparatus can easily previously detect the rapid performance degradation of the energy storage device.

The acquisition unit may calculate the capacitance based on measurement using a complex impedance method, to acquire the capacitance.

Thus, the deterioration state detection apparatus calculates the capacitance based on the measurement using the complex impedance method. Consequently, the deterioration state detection apparatus can acquire the capacitance to previously detect the rapid performance degradation of the energy storage device with high accuracy.

When a frequency at a point, where an imaginary axis component of an arc appearing when drawing a Nyquist diagram based on the measurement using the complex impedance method is a maximum value, is defined as a top frequency, the acquisition unit may acquire the capacitance in a case where the top frequency is a predetermined threshold value or less.

Herein, as a result of inventive studies and experiments, the inventors of the present application have found that in a case where the top frequency is larger than the predetermined threshold value, even when the energy storage device does not deteriorate, the value of the capacitance becomes considerably small. Therefore, the deterioration state detection apparatus acquires the capacitance in a case where the top frequency is the predetermined threshold value or less. Consequently, the deterioration state detection apparatus can previously detect the rapid performance degradation of the energy storage device with high accuracy.

The determination unit may limit a charging upper limit voltage of the energy storage device or an energizing maximum current to the energy storage device based on a determination result of the deterioration state of the energy storage device.

Thus, in a case where the deterioration state detection apparatus previously determines the rapid performance degradation of the energy storage device, the deterioration state detection apparatus limits the charging upper limit voltage of the energy storage device or the energizing maximum current to the energy storage device. Consequently, the deterioration state detection apparatus can suppress the rapid performance degradation of the energy storage device, and extend life.

Hereinafter, a deterioration state detection apparatus and an energy storage system including the deterioration state detection apparatus according to an embodiment of the present invention is described with reference to the drawings. The embodiments described below each are a preferred embodiment of the present invention. Numerical values, shapes, materials, components, placement positions and connection mode of the components, steps, the order of steps, and the like described in the following embodiments are an example, and are not the gist that limits the present invention. Additionally, in the components of the following embodiments, components which are not recited in an independent claim representing a top concept of the present invention are described as arbitrary components configuring more preferred embodiments.

Now, a configuration of an energy storage system 10 is described.

FIG. 1 is an external view of the energy storage system 10 including a deterioration state detection apparatus 100 according to the embodiment of the present invention.

As illustrated in this figure, the energy storage system 10 includes a deterioration state detection apparatus 100, a plurality of (6 in this figure) energy storage devices 200, and a housing case 300 that houses the deterioration state detection apparatus 100 and the plurality of energy storage devices 200.

The deterioration state detection apparatus 100 is disposed above the plurality of energy storage devices 200, and is a circuit board equipped with a circuit that detects the deterioration state of the plurality of energy storage devices 200. Specifically, the deterioration state detection apparatus 100 is connected to the plurality of energy storage devices 200, acquires information from the plurality of energy storage devices 200, and previously detects the rapid degradation of the battery performance of the plurality of energy storage devices 200.

A previously detected state before (right before) the rapid performance degradation of the energy storage devices 200 is caused is referred to as a state before performance degradation. That is, the deterioration state detection apparatus 100 detects the state before performance degradation of the energy storage devices 200.

Herein, the deterioration state detection apparatus 100 is disposed above the plurality of energy storage devices 200. However, the deterioration state detection apparatus 100 may be disposed at any place. A detailed function configuration of this deterioration state detection apparatus 100 will be described later.

The energy storage devices 200 are secondary batteries that can charge and discharge electricity. More specifically, the energy storage devices 200 are nonaqueous electrolyte secondary batteries such as lithium ion secondary batteries. In this embodiment, six rectangular energy storage devices 200 are disposed in series to configure an assembled battery. The number of the energy storage devices 200 is not limited to six, and may be a plural number other than six, or one. Additionally, the shapes of the energy storage devices 200 are not particularly limited.

The energy storage devices 200 are not limited to the nonaqueous electrolyte secondary batteries, and may be secondary batteries other than the nonaqueous electrolyte secondary batteries, or may be capacitors. The energy storage devices 200 that are an object, the deterioration state of which the deterioration state detection apparatus 100 detects, are preferably lithium ion secondary batteries.

Specifically, the energy storage devices 200 each has a positive electrode formed with a positive electrode active material layer on a long band-shaped positive electrode substrate foil formed of aluminum, an aluminum alloy, or the like, and a negative electrode formed with a negative electrode active material layer on a long band-shaped negative electrode substrate foil formed of copper, a copper alloy, or the like. Herein, as the positive electrode active material used in the positive electrode active material layer, or the negative electrode active material used in the negative electrode active material layer, known materials can be appropriately used, as long as the positive electrode active material or the negative electrode active material is a positive electrode active material or a negative electrode active material capable of occluding and releasing lithium ions.

Herein, the energy storage devices 200 each may be a lithium ion secondary battery containing a lithium transition metal oxide having a layered structure as the positive electrode active material. Specifically, the example of the positive electrode active material includes a material using a lithium transition metal oxide having a layered structure of $Li_{1+x}M_{1-y}O_2$ (M is one or at least two kinds of transition metal elements selected from Fe, Ni, Mn, Co and the like, $0 \leq x < 1/3$, $0 \leq y < 1/3$) or the like such as $LiNi_{1/3}Co_{1/3}Mn_{1/3}O_2$. As the positive electrode active material, a material used by mixing a spinel type lithium manganese oxide such as $LiMn_2O_4$ and $LiMn_{1.5}Ni_{0.5}O_4$, or an olivine type positive electrode active material such as $LiFePO_4$, and a lithium transition metal oxide having the above layered structure may be used. Additionally, the examples of the negative electrode active material include an alloy capable of occluding and releasing lithium, a carbon material (e.g., graphite, hardly graphitizable carbon, easily graphitizable carbon, low-temperature sintered carbon, amorphous carbon, or the like), a silicon oxide, a metal oxide, a lithium metal oxide ($Li_4Ti_6O_{12}$ or the like), a polyphosphoric acid compound, and the like, in addition to lithium metal, and a lithium alloy (lithium metal containing alloy such as lithium-silicon, lithium-aluminum, lithium-lead, lithium-tin, lithium-aluminum-tin, lithium-gallium, and wood's metal).

Now, the detailed function configuration of the deterioration state detection apparatus 100 is described.

Figure 2:
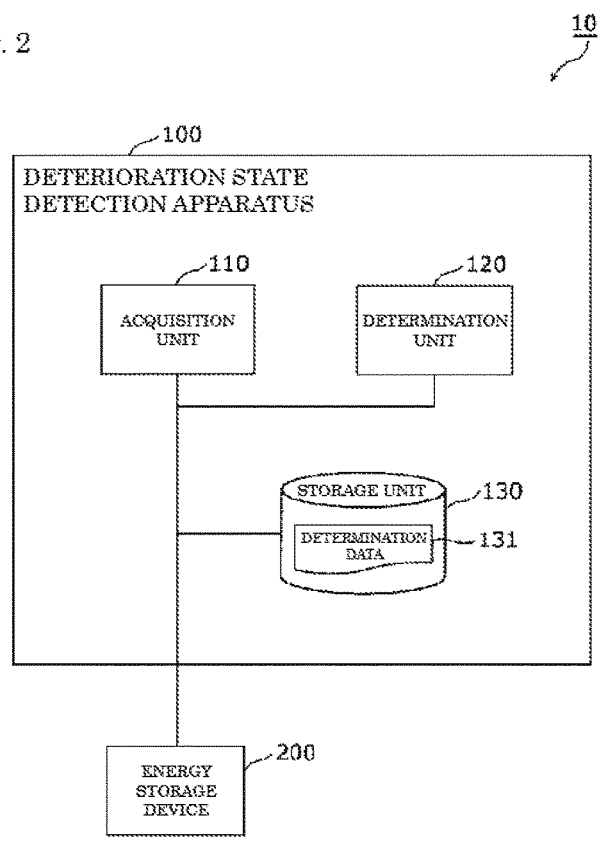
FIG. 2 is a block diagram illustrating a functional configuration of the deterioration state detection apparatus according to the embodiment of the present invention.
Figures 3, 4:
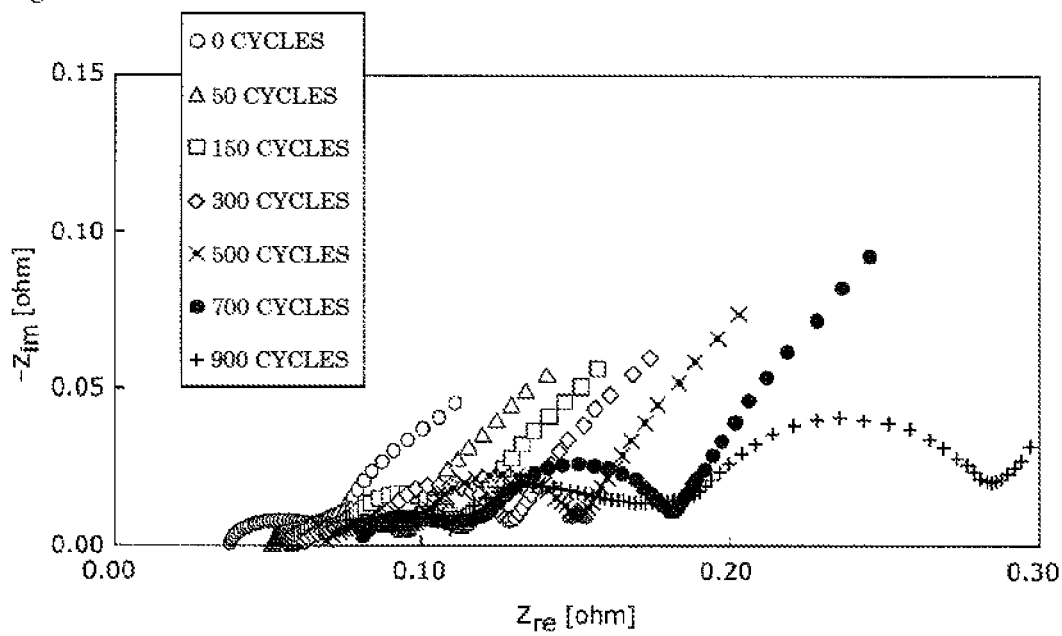
FIG. 3 is a diagram illustrating an example of determination data of a storage unit according to the embodiment of the present invention.
FIG. 4 is a diagram illustrating an example of a data acquired by an acquisition unit according to the embodiment of the present invention, as a Nyquist diagram.

FIG. 2 is a block diagram illustrating the functional configuration of the deterioration state detection apparatus 100 according to the embodiment of the present invention. FIG. 3 is a diagram illustrating an example of determination data 131 of a storage unit 130 according to the embodiment of the present invention.

The deterioration state detection apparatus 100 is an apparatus that detects the deterioration state of the energy storage devices 200. Specifically, the deterioration state detection apparatus 100 is an apparatus that previously detects the rapid performance degradation of the energy storage devices 200, namely detects the state before performance degradation of the energy storage devices 200. As illustrated in this figure, the deterioration state detection apparatus 100 includes an acquisition unit 110, the determination unit 120, and a storage unit 130.

The storage unit 130 is a memory that stores the determination data 131 for determining whether or not the energy storage devices 200 are in the state before performance degradation. Herein, the determination data 131 is a collection of pieces of information necessary for determining whether or not the energy storage devices 200 are in the state before performance degradation. Specifically, as illustrated in FIG. 3, capacitance values and the like at a plurality of time points up to a predetermined determination time point such as a first time point, a second time point are stored and the like.

The acquisition unit 110 acquires the capacitances of the energy storage devices 200. That is, the acquisition unit 110 acquires the capacitance values at the plurality of time points up to the predetermined determination time point, such as the first time point, the second time point, and the like, and writes the acquired capacitance values in the determination data 131 of the storage unit 130.

The determination unit 120 determines the deterioration state of the energy storage devices 200, from the change of the capacitances acquired by the acquisition unit 110. Specifically, the determination unit 120 determines whether or not the energy storage devices 200 are in the state before performance degradation, from the change of the above capacitances.

Consequently, the deterioration state detection apparatus 100 can detect the deterioration state of the energy storage devices 200, namely, the state before performance degradation of the energy storage devices 200.

Herein, the acquisition unit 110 acquires the above capacitances by using various methods, for example, acquires the capacitances of the energy storage devices 200 by measurement by a LCR meter or the like, or acquires the capacitances of the energy storage device 200 based on data acquired by a complex impedance method. Hereinafter, as an example of the method for enabling acquisition of the above capacitances, a method for acquiring the capacitances of the energy storage devices 200 by using the complex impedance method is described.

A processing procedure is described by partially using a Nyquist diagram in the following description. The Nyquist diagram is merely a diagram for explaining what a process performed inside the apparatus in a process of acquiring capacitances from data acquired by the complex impedance method substantially means. It goes without saying that the Nyquist diagram is visually drawn inside the apparatus where the process of acquiring capacitances is performed by the acquisition unit 110.

The acquisition unit 110 first acquires a data row formed by combining a frequency (f), a real axis impedance ($Z_{re}$), and an imaginary axis impedance ($-Z_{im}$), by measurement using the complex impedance method. That is, this data row includes information enough to generate the Nyquist diagram, when this is plotted.

The acquisition unit 110 acquires an impedance R equivalent to the width of a real axis component of an impedance in an arc represented in the Nyquist diagram, and a top frequency f equivalent to a frequency at a point where an imaginary axis component of the impedance is a maximum value in the arc, based on the above data row. That is, it can be said that the acquisition unit 110 performs operation equivalent to a process of extracting a portion of the arc shape represented in the Nyquist diagram, defining the width of the real axis component of the impedance corresponding to the diameter of the arc shape as the impedance R, defining the frequency at the point where the imaginary axis component of the impedance in the arc is the maximum value as the top frequency f, and acquiring the impedance R and the top frequency f.

The acquisition unit 110 calculates a capacitance by using a relational expression of capacitance $C=1/(2\pi fR)$ from the acquired impedance R and top frequency f. That is, the acquisition unit 110 calculates the capacitance C by substituting the impedance R and the top frequency f in the relational expression of capacitance $C=1/(2\pi fR)$. Consequently, the acquisition unit 110 acquires the capacitance.

Herein, the acquisition unit 110 acquires a capacitance calculated from an impedance and a top frequency and corresponding to each time point, at each of the plurality of time points up to the predetermined determination time point. The determination time point is a time point where the determination unit 120 determines whether or not the energy storage devices 200 are in the state before performance degradation, described later. The details will be described later.

That is, the acquisition unit 110 performs measurement using the complex impedance method, at the plurality of time points up to the predetermined determination time point, and calculates the capacitance C from the impedance R equivalent to the diameter of the arc appearing when the Nyquist diagram is drawn based on this result, and the top frequency f which is the frequency at the point where the imaginary axis component of the arc is the maximum value, so that the acquisition unit 110 acquires the capacitance at each time point.

When the capacitance at each time point is acquired, the acquisition unit 110 acquires the capacitance in a case where the top frequency is a predetermined threshold value or less. That is, the acquisition unit 110 determines whether or not the top frequency is the predetermined threshold value or less. In a case where the acquisition unit 110 determines that the top frequency is the predetermined threshold value or less, the acquisition unit 110 acquires a capacitance corresponding to this top frequency. This is because in a case where the top frequency is larger than the predetermined threshold value, even when the energy storage devices 200 are not deteriorated, the value of the capacitance becomes considerably small. The predetermined threshold value is, for example, 10 Hz.

Herein, the acquisition unit 110 writes impedances and top frequencies at the respective time point up to the determination time point in the determination data 131 of the storage unit 130, and writes capacitances calculated from the impedances and the top frequencies in the determination data 131.

The acquisition unit 110 may write only values of the capacitances at the respective time points up to the determination time points in the determination data 131. In this case, only the capacitances at the plurality of time points up to the predetermined determination time point are stored in the determination data 131.

Herein, the determination time point, and the plurality of time points up to the determination time point are described.

The determination time point is a time point after a predetermined period elapses from start of use accompanied with the charge-discharge of the energy storage devices 200. The predetermined period may be any period, and is not particularly limited. Additionally the unit of the predetermined period is not particularly limited, and is, for example, a period of second order, minute order, hour order, day order, month order, or the like. That is, the determination time point may be represented by any unit such as second, minute, hour, day, and month.

The plurality of time points up to the determination time point is a plurality of time points up to a determination time point from a time point that is a reference for detecting the state before performance degradation, and is, for example, a plurality of time points up to a determination time point from a time point when the energy storage devices 200 are in an initial state. The time point when the energy storage devices 200 are in the initial state means a production time point of the energy storage devices 200, a factory shipment time point of the energy storage devices 200, an equipment time point of an electric vehicle or the like to an application apparatus, or the like.

The plurality of time points are not limited to the plurality of time points up to the determination time point from the time point when the energy storage devices 200 are in the initial state. For example, the plurality of time points may be the plurality of time points up to the determination time point from the time point after the predetermined period elapses from the start of the use accompanied with the charge-discharge of energy storage devices 200. Additionally, an interval of the plurality of time points may be any period interval such as second order, minute order, hour order, day order, and month order, and the plurality of time points may be represented by any unit of minute, hour, day, month, or the like.

However, for example, in a case where the plurality of time points are considerably small, or in a case where the plurality of time points are unevenly distributed right before the state before performance degradation, there is a fear that the determination unit 120 cannot perform accurate determination. Therefore, since it is possible to predict a rough period up to performance degradation from the start of the use of the energy storage devices 200, the above plurality of time points are preferably set such that the use start time point of the energy storage devices 200 is included, and at least several points up to the performance degradation are included.

Now, processes performed by the determination unit 120 are described in detail.

The determination unit 120 determines the deterioration state of the energy storage devices 200, from the change of the capacitances acquired by the acquisition unit 110. Specifically, the determination unit 120 determines whether or not the energy storage devices 200 are in the state before performance degradation, from the change of the capacitances. That is, the determination unit 120 previously determines whether or not the rapid degradation of capacity enabling charge or discharge of the energy storage devices 200 will be caused, from the change of the capacitances, or previously determines whether or not the rapid degradation of input-output performance indicated by the input-output performance of the energy storage devices 200 will be caused. Consequently, the determination unit 120 previously determines whether or not the rapid performance degradation of the energy storage devices 200 will be caused.

Specifically, the determination unit 120 averages a plurality of capacitances calculated and acquired before the determination time point by the acquisition unit 110, and calculates a capacitance average value that is an average value of the capacitances calculated before the determination time point. That is, the determination unit 120 reads out the plurality of capacitances acquired before the determination time point by the acquisition unit 110, from the determination data 131 of the storage unit 130, and calculates the average value of the plurality of capacitances.

Then, the determination unit 120 compares a determination capacitance being a capacitance calculated at the predetermined determination time point with the capacitance average value, so that the determination unit 120 determines whether or not the energy storage devices 200 are in the state before performance degradation at the determination time point. That is, the determination unit 120 reads out the capacitance calculated and acquired at the determination time point by the acquisition unit 110 from the determination data 131, and compares the read capacitance with the calculated capacitance average value.

Specifically the determination unit 120 determines whether or not the determination capacitance is smaller than 85% of the capacitance average value, so that the determination unit 120 determines the deterioration state of the energy storage devices 200 at the determination time point. That is, the determination unit 120 calculates a value of 85% of the capacitance average value, and compares the calculated value of 85% of the capacitance average value with the determination capacitance, so that the determination unit 120 determines whether or not the energy storage devices 200 are in the state before performance degradation at the determination time point.

Then, in a case where the determination unit 120 determines that the determination capacitance is smaller than 85% of the capacitance average value, the determination unit 120 determines that the energy storage devices 200 are in the state before performance degradation at the determination time point.

Thus, the determination unit 120 determines whether or not the determination capacitance is smaller than a reference value, so that the determination unit 120 determines the deterioration state of the energy storage devices 200 at the determination time point. That is, the determination unit 120 employs a value obtained by multiplying the capacitance average value by a predetermined constant as the reference value to determine whether or not the determination capacitance is smaller than the reference value, so that the determination unit 120 determines the deterioration state of the energy storage devices 200 at the determination time point. More specifically, the determination unit 120 employs 0.8 and 0.9 as the constant to determine whether or not the determination capacitance is smaller than the reference value, so that the determination unit 120 determines the deterioration state of the energy storage devices 200 at the determination time point. In this embodiment, the constant is 0.85 (85%). The constant is not limited to 0.85, but the following description is made while 0.85 (85%) is employed as the constant.

The determination unit 120 may write the calculated capacitance average value or the value of 85% of the capacitance average value in the determination data 131 of the storage unit 130, and then use the value to determine whether or not the energy storage devices 200 are in the state before performance degradation. Additionally, the deterioration state detection apparatus 100 may not include the storage unit 130, the acquisition unit 110 may store a value of the capacitance or the like in other apparatus, and the determination unit 120 may acquire the value of the capacitance from other apparatus, so that it may be determined whether or not the energy storage devices 200 are in the state before performance degradation.

Then, the determination unit 120 limits a charging upper limit voltage of the energy storage devices 200 or an energizing maximum current to the energy storage devices 200, based on a determination result of the deterioration state of the energy storage devices 200.

Specifically, in a case where the determination unit 120 determines that the energy storage devices 200 are in the state before performance degradation, the determination unit 120 emits a signal for limiting the charging upper limit voltage of the energy storage devices 200, and stops the charge of the energy storage devices 200 before the energy storage devices 200 are fully charged. Alternatively in a case where the determination unit 120 determines that the energy storage devices 200 are in the state before performance degradation, the determination unit 120 emits the signal for limiting the energizing maximum current to the energy storage devices 200, and suppress an excessive current value flowing in the energy storage devices 200.

The determination unit 120 may perform warning before limiting the charging upper limit voltage or the energizing maximum current, in place of the limiting, or may stop the charge to the energy storage devices 200 in a case where the determination unit 120 determines that the energy storage devices 200 are in the state before performance degradation.

Now, an example of a process of acquiring the capacitances of the energy storage devices 200, performed by the acquisition unit 110 is described with reference to the Nyquist diagram.

In FIG. 4, a result obtained by actually repeatedly performing charge-discharge by using the energy storage devices 200 according to the embodiment of the present invention, and performing complex impedance measurement in a 0th cycle, a 50th cycle, a 150th cycle, a 300th cycle, a 500th cycle, a 700th cycle, and a 900th cycle is plotted in a form of a Nyquist diagram.

Herein, as illustrated in this figure, in each cycle, an arc-shaped part is represented in the Nyquist diagram. Each arc-shaped part migrates to the right (direction in which the value of the real axis component of the impedance increases), and increases a diameter, as the use of the energy storage devices 200 is continued (as the number of cycles increases).

That is, as the use of the energy storage devices 200 is continued, the impedance which is the width of the real axis component of the impedance corresponding to the diameter of the arc shape increases, and the top frequency, which is the frequency at the point where the imaginary axis component of the impedance in the arc shape becomes the maximum value, reduces.

Now, a process of detecting the deterioration state of the energy storage devices 200 (state before performance degradation), performed by the deterioration state detection apparatus 100 is described.

Figure 5:
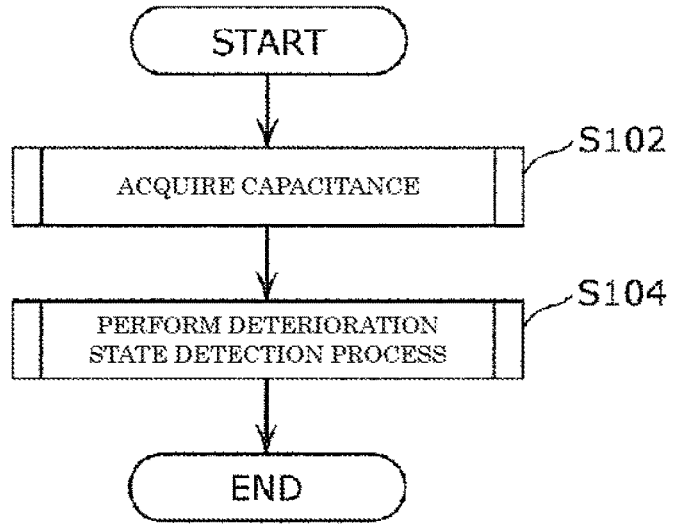
FIG. 5 is a flowchart illustrating an example of a process of detecting the deterioration state of an energy storage device, performed by the deterioration state detection apparatus according to the embodiment of the present invention.

FIG. 5 is a flowchart illustrating an example of the process detecting the deterioration state of the energy storage devices 200, performed by the deterioration state detection apparatus 100 according to the embodiment of the present invention.

As illustrated in this figure, the acquisition unit 110 first acquires capacitances at the plurality of time points up to the determination time point (S102). Detailed description of the process of acquiring the capacitances, performed by the acquisition unit 110 will be described later.

Then, the determination unit 120 determines the deterioration state of the energy storage devices 200 (S104). Specifically, the determination unit 120 determines whether or not the energy storage devices 200 are in the state before performance degradation, from the change of the capacitances acquired by the acquisition unit 110. Detailed description of the process of determining the deterioration state of the energy storage devices 200, performed by the determination unit 120 will be described later.

Thus, the process of detecting the deterioration state of the energy storage devices 200 (state before performance degradation), performed by the deterioration state detection apparatus 100 is terminated.

Now, a process of acquiring capacitances, performed by the acquisition unit 110 (S102 in FIG. 5), is described in detail.

As described above, the acquisition unit 110 can acquire capacitances of the energy storage device 200 by using various methods. However, as an example of the method for enabling acquisition of the above capacitances, a method for acquiring the capacitances of the energy storage devices 200 based on data acquired by the complex impedance method is hereinafter described.

Figure 6:
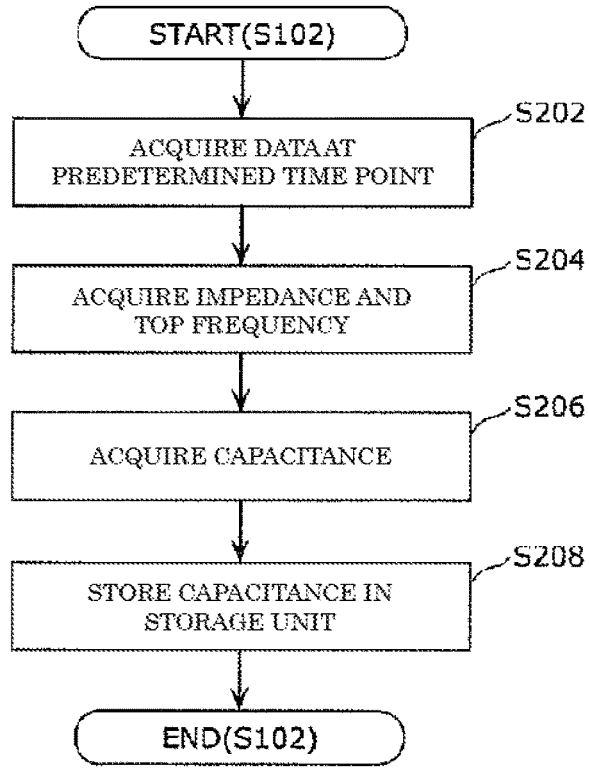
FIG. 6 is a flowchart illustrating an example of a process of acquiring capacitances, performed by the acquisition unit according to the embodiment of the present invention.
Figure 7A:
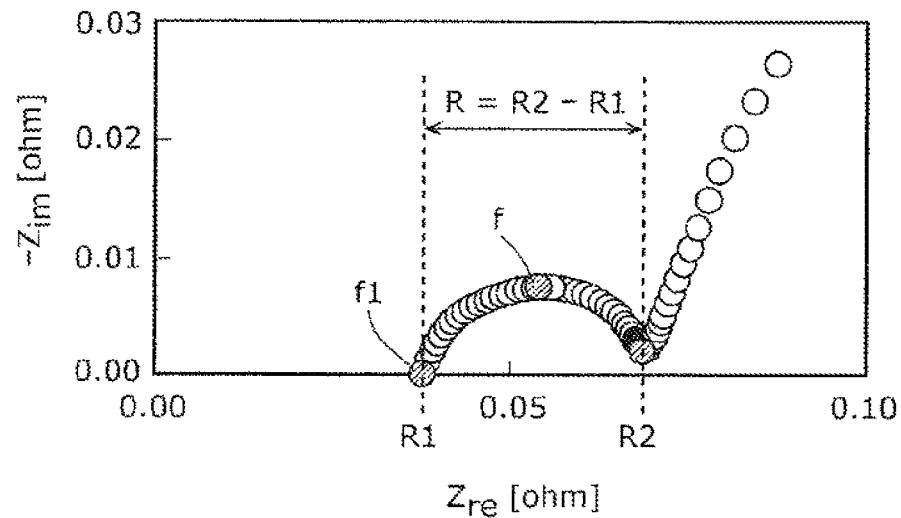
FIG. 7A is a diagram for explaining the process of acquiring capacitances, performed by the acquisition unit according to the embodiment of the present invention.
Figure 7B:
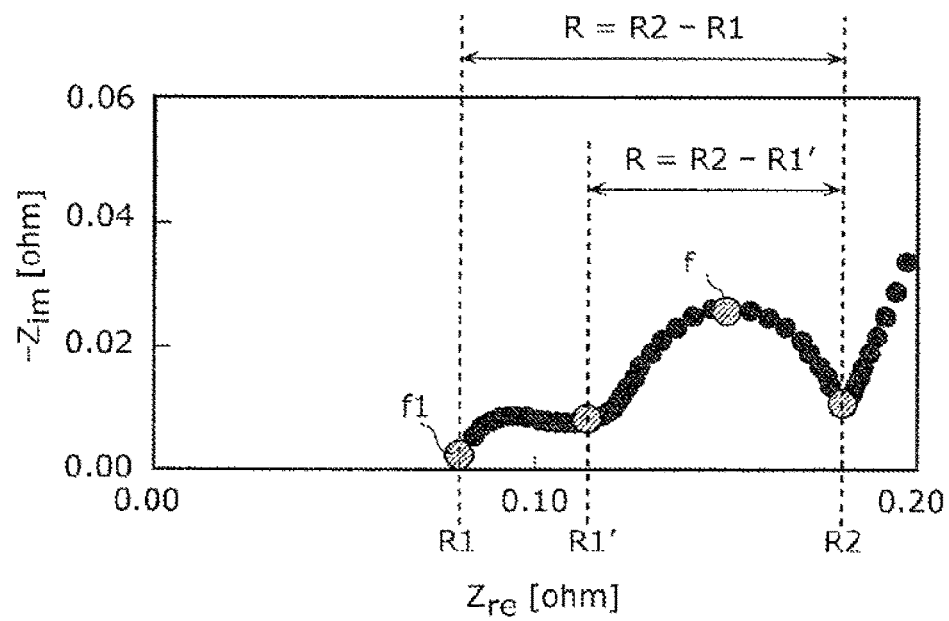
FIG. 7B is a diagram for explaining the process of acquiring capacitances, performed by the acquisition unit according to the embodiment of the present invention.

FIG. 6 is a flowchart illustrating an example of the process of acquiring capacitances, performed by the acquisition unit 110 according to the embodiment of the present invention. FIG. 7A and FIG. 7B each is a diagram for explaining the process of acquiring the capacitances, performed by the acquisition unit according to the embodiment of the present invention. Specifically, FIG. 7A is a graph obtained by plotting data in the beginning of a life acquired by the acquisition unit 110 in the form of the Nyquist diagram, and FIG. 7B is a graph obtained by plotting data in life middle and subsequent periods acquired by the acquisition unit 110 in the form of the Nyquist diagram.

As illustrated in FIG. 6, the acquisition unit 110 first acquires data at the predetermined time point by measurement using the complex impedance method (S202).

Specifically, the acquisition unit 110 applies an AC signal to the energy storage devices 200, measures a complex impedance, and acquires a data row formed by combining frequencies (f), real axis impedances ($Z_{re}$), and imaginary axis impedances ($-Z_{im}$). When this data row is plotted, in the beginning of the life, the arc illustrated in FIG. 7A is represented as one Nyquist diagram, and in the life middle and subsequent periods, two arcs illustrated in FIG. 7B are represented as the Nyquist diagram.

Then, the acquisition unit 110 acquires an impedance equivalent to the diameter of the arc on the Nyquist diagram, and a frequency corresponding to an arc top (S204). That is, it can be said that the acquisition unit 110 performs a process equivalent to a process of extracting an arc-shaped part represented in the Nyquist diagram, acquiring the width of the real axis component of the impedance corresponding to the diameter of the arc shape as the impedance R, and acquiring the frequency at a point where the imaginary axis component of the impedance in the arc shape becomes the maximum value, as the top frequency f.

Herein, in the Nyquist diagram illustrated in FIG. 7A, a maximum frequency in a frequency range where $-Z_{im} \geq 0$ is satisfied is denoted by f1, and $Z_{re}$ when the frequency is f1 is defined as the impedance R1. At an arc part located on a low frequency side with respect to the frequency f1, a minimum frequency in a frequency when $-Z_{im}$ becomes the maximum value is defined as the top frequency f. Then, in a low frequency range with respect to the top frequency f, $Z_{re}$ when $-Z_{im}$ is a minimum value is defined as an impedance R2. Then, the impedance R is calculated by R=R2−R1.

Thus, in the beginning of the life, the acquisition unit 110 acquires the top frequency f and the impedance R.

In the Nyquist diagram illustrated in FIG. 7B, a maximum frequency in a frequency range where $-Z_{im} \geq 0$ is satisfied is denoted by f1, $Z_{re}$ when the frequency is f1 is defined as an impedance R1. Additionally in the are part located on the low frequency side with respect to the frequency f1, a minimum frequency in frequencies when $-Z_{im}$ becomes the maximum value is defined as the top frequency f. In a frequency range where the frequency is larger than the top frequency f and is smaller than the frequency f1, $Z_{re}$ when $-Z_{im}$ takes a minimum value is defined as an impedance R1' (in a case where $Z_{re}$ which takes the minimum value does not exist, R1' is not defined). Then, in the low frequency range with respect to the frequency is lower than the top frequency f, $Z_{re}$ when $-Z_{im}$ takes the minimum value is defined as an impedance R2. Then, the impedance R is calculated by R=R2−R1' or R=R2−R1.

Thus, in the life middle and subsequent periods the acquisition unit 110 acquires the top frequency f and the impedance R. Also in the life middle and subsequent periods, a Nyquist diagram sometimes becomes the Nyquist diagram illustrated in FIG. 7A. In this case, the acquisition unit 110 acquires the top frequency f and the impedance R from the Nyquist diagram illustrated in FIG. 7A also in the life middle and subsequent periods.

As the impedance R, R=R2−R1' on the low frequency side (arc part on the right) may be used, or R=R2−R1 including a high frequency side (arc part on the left side) may be used. However, using of R=R2−R1' on the low frequency side is preferable.

This is because capacitances calculated from R=R2−R1' on the low frequency side result from a positive electrode, and the rapid degradation of battery performance can be previously detected by the change of the capacitances.

However, in a case where the two arc parts on the low frequency side and the high frequency side are difficult to be separated, it is difficult to use R=R2−R1' on the low frequency side. Therefore, as a result of inventive studies and experiments, the inventors of the present application have found that since the arc part on the high frequency side is relatively small, and R=R2−R1 including the high frequency side can be use in place of R=R2−R1' on the low frequency side.

Therefore, the acquisition unit 110 preferably operates such that R=R2−R1' on the low frequency side is acquired as the impedance R, but may operates such that R=R2−R1 including the high frequency side is acquired.

The acquisition unit 110 preferably unifies and acquires impedances R on the same frequency side. That is, in a case where the acquisition unit 110 acquires R=R2−R1' on the low frequency side, the acquisition unit 110 preferably always acquires R=R2−R1', and in a case where the acquisition unit 110 acquires R=R2−R1 including the high frequency side, the acquisition unit 110 preferably always acquires R=R2−R1. Consequently, it is possible to avoid the rapid change of the impedances R acquired by the acquisition unit 110 and the erroneous determination of the deterioration state.

However, the acquisition unit 110 may not unify and acquire impedances R on the same frequency in a case where the top frequency is larger than the predetermined threshold value, described later. That is, in a case where the top frequency in an impedance R first acquired by R=R2−R1 is larger than the predetermined threshold value, the acquisition unit 110 may acquire a next impedance R by using R=R2−R1'.

The acquisition unit 110 writes the acquired top frequency f and impedance R in the determination data 131 of the storage unit 130.

Returning to FIG. 6, the acquisition unit 110 calculates a capacitance from the acquired impedance and a top frequency to acquire the capacitance (S206). That is, the acquisition unit 110 reads out the top frequency f and the impedance R from the determination data 131, substitutes the impedance R and the top frequency f in the relational expression of capacitance $C=1/(2\pi fR)$, and calculates the capacitance C.

The acquisition unit 110 acquires a capacitance in a case where the top frequency is the predetermined threshold value or less. For example, the acquisition unit 110 acquires a capacitance in a case where the top frequency f is 10 Hz or less.

That is, the inventors of the present application have found that in a case where the energy storage devices 200 are not deteriorated, the top frequency calculated in accordance with a definition is larger than the predetermined threshold value. That is, it is considered that in the beginning of a deterioration, the top frequency is a frequency including both a positive electrode and a negative electrode, and may be larger than the predetermined threshold value. However, in the present invention, as described above, the rapid degradation of battery performance can be previously detected by using the capacitances calculated from the top frequency including the information of the positive electrode, and therefore it is necessary to exclude frequencies including the information of the negative electrode. Therefore, the acquisition unit 110 acquires the capacitance in the case where the top frequency is the predetermined threshold value or less.

Then, the acquisition unit 110 writes the acquired capacitances in the determination data 131 of the storage unit 130 (S208).

Thus, the process of acquiring the capacitances, performed by the acquisition unit 110 (S102 in FIG. 5) is terminated. The acquisition unit 110 thus acquires the capacitances at the plurality of time points up to the determination time point, and stores the respective capacitances in the determination data 131.

Now, a process of determining the deterioration state of the energy storage devices 200, performed by the determination unit 120 (S104 in FIG. 5) is described in detail.

Figure 8:
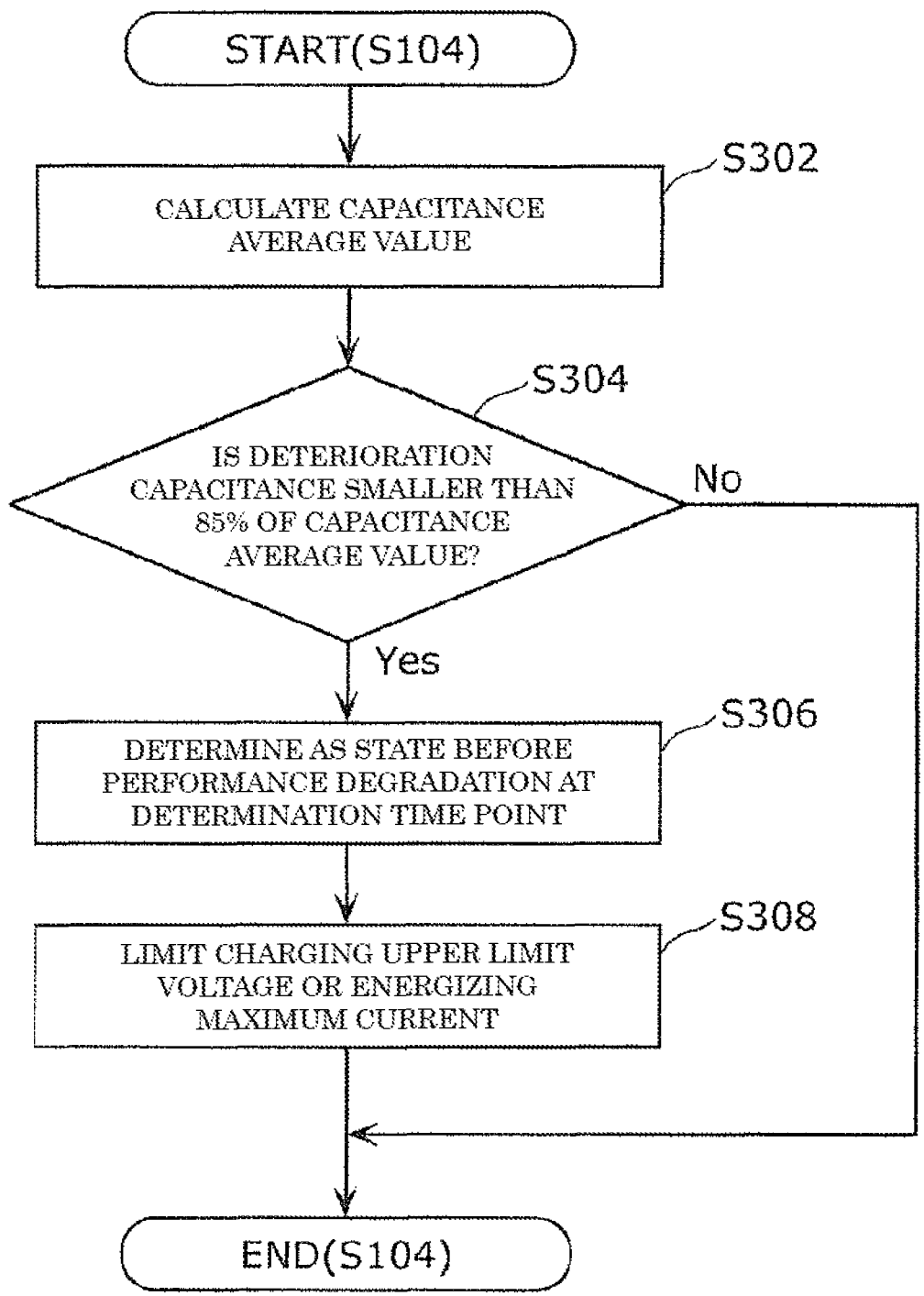
FIG. 8 is a flowchart illustrating an example of a process of determining the deterioration state of the energy storage device, performed by a determination unit according to the embodiment of the present invention.

FIG. 8 is a flowchart illustrating an example of the process of determining the deterioration state of the energy storage devices 200, performed by the determination unit 120 according to the embodiment of the present invention. FIG. 9A, FIG. 9B, FIG. 10A, and FIG. 10B each are a diagram for explaining the process of determining the deterioration state of the energy storage devices 200, performed by the determination unit 120 according to the embodiment of the present invention.

In the following, as to an effect of the present invention characterizing the use of change in capacitances in order to determine the deterioration state of the energy storage devices 200, data obtained by using the complex impedance method is shown, in order to perform comparison with other method.

Figures 9A, 9B:
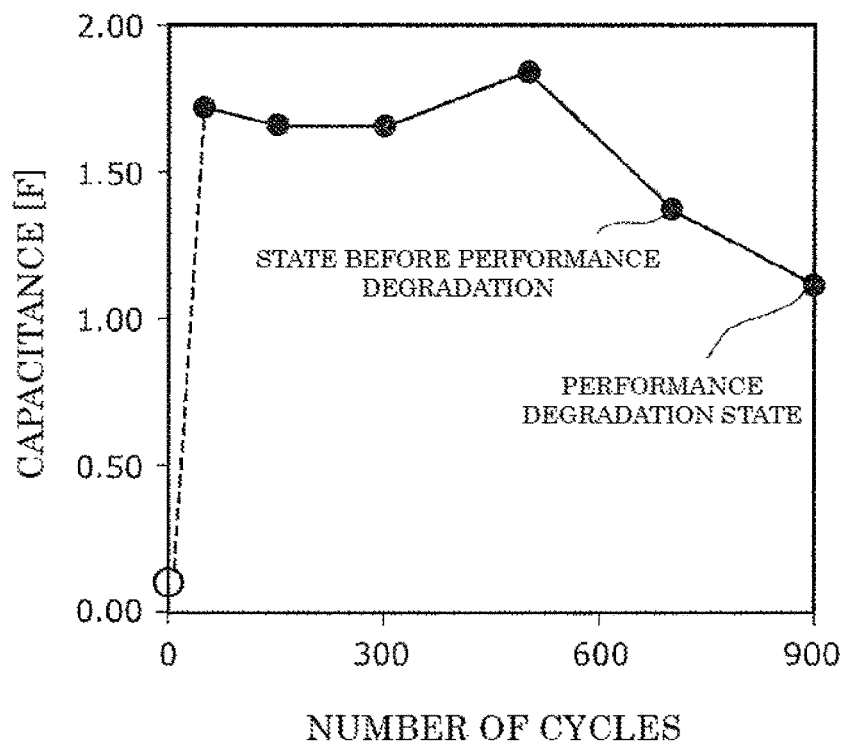
FIG. 9A is a diagram for explaining the process of determining the deterioration state of the energy storage device, performed by the determination unit according to the embodiment of the present invention.
FIG. 9B is a diagram for explaining the process of determining the deterioration state of the energy storage device, performed by the determination unit according to the embodiment of the present invention.
Figures 10A, 10B:
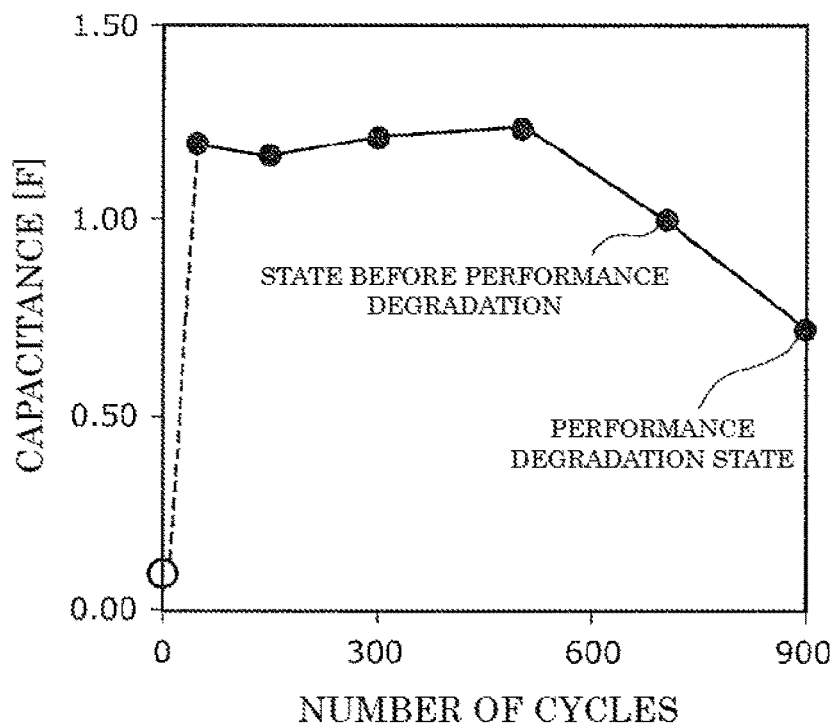
FIG. 10A is a diagram for explaining the process of determining the deterioration state of the energy storage device, performed by the determination unit according to the embodiment of the present invention.
FIG. 10B is a diagram for explaining the process of determining the deterioration state of the energy storage device, performed by the determination unit according to the embodiment of the present invention.

Specifically FIG. 9A is a table illustrating an example of a result in a case where complex impedance measurement is performed as needed up to the performance degradation state from the start of the use of the energy storage devices 200 (in a case where the impedance R is obtained by R2−R1'), and FIG. 9B is a graph obtained by plotting the change of the capacitances based on this result. FIG. 10A is a table illustrating an example of a result in a case where complex impedance measurement is performed as needed up to the performance degradation state from the start of the use of the energy storage devices 200 (in a case where the impedance R is obtained by R2−R1), and FIG. 10B is a graph obtained by plotting the change of the capacitances based on this result.

As illustrated in FIG. 8, the determination unit 120 averages the plurality of capacitances calculated and acquired before the determination time point by the acquisition unit 110, and calculates the capacitance average value (S302).

Herein, FIG. 9A to FIG. 10B each illustrate a result obtained by performing the following 1 CmA charge-discharge cycle test at 45° C. as a specific example, in order to illustrate an example of the plurality of capacitances acquired at the plurality of time points by the acquisition unit 110, and the capacitance average value calculated by the determination unit 120.

That is, in this 1 CmA charge-discharge cycle test, a lithium ion secondary battery having a positive electrode formed with a positive composite on aluminum foil, and a negative electrode formed with a negative composite on copper foil was used. Herein, the positive composite contains a positive electrode active material, polyvinylidene fluoride as a bonding agent, and acetylene black as a conductive material, and the positive electrode active material is a lithium transition metal oxide having a layered structure, represented by $LiNi_{1/3}Co_{1/3}Mn_{1/3}O_2$. The negative composite contains a graphite carbon material being a negative electrode active material, and styrene-butadiene rubber and carboxymethyl cellulose as a bonding agent. Additionally electrolyte solution was prepared by adding $LiPF_6$ of 1 mol/L in mixed solvent of ethylene carbonate (EC):dimethyl carbonate (DMC):ethyl methyl carbonate (EMC)=25:20:55 (volume ratio).

In the 1 CmA charge-discharge cycle test at 45° C., the charge was constant current constant voltage charge with a current of 1 CmA (=700 mA) and a voltage of 4.2 V for charging time of 3 hours at 45° C., and the discharge was constant current discharge with a current of 1 CmA (=700 mA) and a termination voltage of 2.85 V at 45° C. A pause time of 10 minutes was provided between the charge and the discharge, and between the discharge and the charge. In the pause time, the batteries were in an open circuit state.

In a discharge capacity confirmation test, the charge was constant current constant voltage charge with a current of 1 CmA (=700 mA) and a voltage of 4.2 V for a charging time of 3 hours at 25° C., and the discharge was constant current discharge with a current of 1 CmA (=700 mA) and a termination voltage of 2.85 V at 25° C. A pause time of 10 minutes was provided between the charge and the discharge, and between the discharge and the charge. In the pause time, the batteries were in an open circuit state. That is, 4 processes of the charge, the pause, the discharge, the pause were 1 cycle. This discharge capacity confirmation test was performed after 0 cycles, 50 cycles, 150 cycles, 300 cycles, 500 cycles, 700 cycles and 900 cycles.

As the complex impedance measurement, charge was adjusted until the SOC of the batteries reaches 50%, and measurement with an applied AC voltage of 5 mV was performed to open circuit potential in a measurement frequency range of 0.02 Hz to $10^6$ Hz at 25° C. This complex impedance measurement was performed after 0 cycles, 50 cycles, 150 cycles, 300 cycles, 500 cycles, 700 cycles and 900 cycles.

"The number of cycles" illustrated in FIG. 9A represents that the degree of the use of the energy storage devices 200 is a time point equivalent to the number of cycles in the charge-discharge cycle test. Additionally, in each of the numbers of cycles, "R" denotes the impedance R (=R2−R1'), "f" denotes the top frequency f, "C" denotes the capacitance C, "Cav" denotes a capacitance average value Cav, and "Cav×0.85" denotes a value of 85% of the capacitance average value Cav.

That is, for example, when the degree of the use of the energy storage devices 200 is a time point equivalent to 500 cycles in the charge-discharge cycle test, the acquisition unit 110 acquires data equivalent to a column of "500 cycles" illustrated in FIG. 9A. Then, the determination unit 120 multiplies an average value of capacitances C in 50 cycles, 150 cycles, 300 cycles and 500 cycles (=(1.7+1.7+1.7+1.8)/4=1.73) by 0.85, and calculates 1.47 that is the value of 85% of the capacitance average value Cav.

Similarly, "the number of cycles" illustrated in FIG. 10A represents that the degree of the use of the energy storage devices 200 is a time point equivalent to the number of cycles in the charge-discharge cycle test. Additionally, in each of the numbers of cycles, "R" denotes the impedance R (=R2−R1), "f" denotes the top frequency f, "C" denotes the capacitance C, "Cav" denotes a capacitance average value Cav, and "Cav×0.85" denotes a value of 85% of the capacitance average value Cav.

That is, for example, when the degree of the use of the energy storage devices 200 is a time point equivalent to 500 cycles in the charge-discharge cycle test, the acquisition unit 110 acquires data equivalent to a column of "500 cycles" illustrated in FIG. 10A. Then, the determination unit 120 multiplies an average value of capacitances C in 50 cycles, 150 cycles, 300 cycles and 500 cycles (=(1.2+1.2+1.2+1.2)/4=1.2) by 0.85, and calculates 1.02 that is the value of 85% of the capacitance average value Cav.

In each of FIG. 9A and FIG. 10A, in a case where the number of cycles is 0 cycles (initial state), a top frequency f (=63.1 Hz) is larger than the predetermined threshold value (for example, 10 Hz), and therefore the acquisition unit 110 does not acquire the capacitance C (=0.1 F) in a case where the number of cycles is 0 cycles. Therefore, the determination unit 120 calculates the capacitance average value Cav without including the capacitance C in the case where the number of cycles is 0 cycles.

Herein, depending on the number of times of acquisition of the capacitance C or an acquisition period, there is a case where the determination unit 120 cannot calculate a proper capacitance average value Cav to perform determination. Examples of such a case include a case where the acquisition frequency of the capacitance C is considerably low, and a case where the acquisition of the capacitance C is first started right before the state before performance degradation. In this case, the determination unit 120 determines whether or not the calculated capacitance average value Cav is a proper value to perform determination. In a case where the determination unit 120 determines that the calculated capacitance average value Cav is not the proper value, the determination unit 120 may have a function of making notification to a user by outputting an error or the like.

Returning to FIG. 8, the determination unit 120 determines whether or not the determination capacitance calculated at the predetermined determination time point is smaller than 85% of the capacitance average value (S304).

Specifically, as illustrated in FIG. 9A, in a case where the degree of the use of the energy storage devices 200 is a time point equivalent to 500 cycles in the charge-discharge cycle test, the determination unit 120 determines that determination capacitance C=1.8 is not smaller than 1.45 that is a value of 85% of the capacitance average value Cav in a case where the number of cycles is 300 cycles (No in S304). Additionally, in a case where the degree of the use of the energy storage devices 200 is a time point equivalent to 700 cycles in the charge-discharge cycle test, the determination unit 120 determines that determination capacitance C=1.4 is smaller than 1.47 that is a value of 85% of the capacitance average value Cav in a case where the number of cycles is 500 cycles (Yes in S304).

Similarly, as illustrated in FIG. 10A, in a case where the degree of the use of the energy storage devices 200 is a time point equivalent to 500 cycles in the charge-discharge cycle test, the determination unit 120 determines that determination capacitance C=1.2 is not smaller than 1.02 that is a value of 85% of the capacitance average value Cav in a case where the number of cycles is 300 cycles or less (No in S304). Additionally, in a case where the degree of the use of the energy storage devices 200 is a time point equivalent to 700 cycles in the charge-discharge cycle test, the determination unit 120 determines that determination capacitance C=1.0 is smaller than 1.02 that is a value of 85% of the capacitance average value Cav in a case where the number of cycles is 500 cycles or less (Yes in S304).

Returning to FIG. 8, in a case where the determination unit 120 determines that the determination capacitance is smaller than 85% of the capacitance average value (Yes in S304), the determination unit 120 determines that the energy storage devices 200 are in the state before performance degradation at the determination time point (S306).

Specifically, as illustrated in FIG. 9A and FIG. 10A, in a case where the degree of the use of the energy storage devices 200 is the time point equivalent to 700 cycles in the charge-discharge cycle test, the determination unit 120 determines that the determination capacitance is smaller than the capacitance average value, and therefore the determination unit 120 determines that the energy storage devices 200 are in the state before performance degradation at this time point. As illustrated in FIG. 9B and FIG. 10B, it is found that when the number of cycles is 700 cycles and the subsequent cycles, the value of the capacitance is rapidly degraded.

Returning to FIG. 8, in a case where the determination unit 120 determines that the determination capacitance is not smaller than 85% of the capacitance average value (No in S304), the process is terminated.

In a case where the determination unit 120 determines that the energy storage devices 200 are in the state before performance degradation, the determination unit 120 limits the charging upper limit voltage of the energy storage devices 200 or the energizing maximum current to the energy storage devices 200 (S308). That is, in a case where the determination unit 120 determines that the energy storage devices 200 are in the state before performance degradation at the determination time point, the determination unit 120 controls to suppress the rapid performance degradation of the energy storage devices 200.

Thus, the process of determining the deterioration state of the energy storage devices 200, performed by the determination unit 120 (S104 in FIG. 5) is terminated.

Now, a situation where the deterioration state detection apparatus 100 can detect the deterioration state of the energy storage devices 200 (state before performance degradation) is described.

Figure 11A:
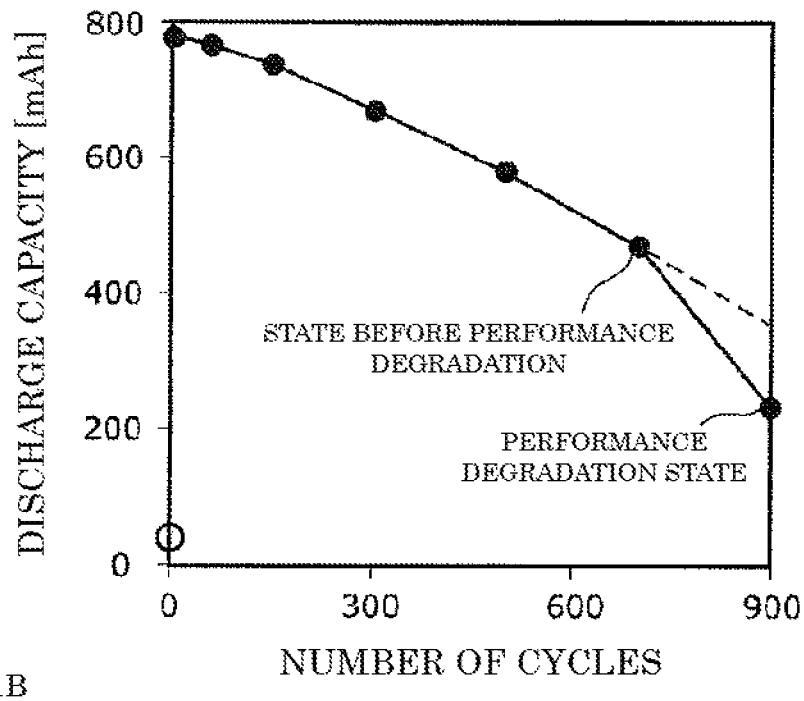
FIG. 11A is a diagram for explaining that the deterioration state of the energy storage device can be detected by the deterioration state detection apparatus according to the embodiment of the present invention.
Figure 11B:
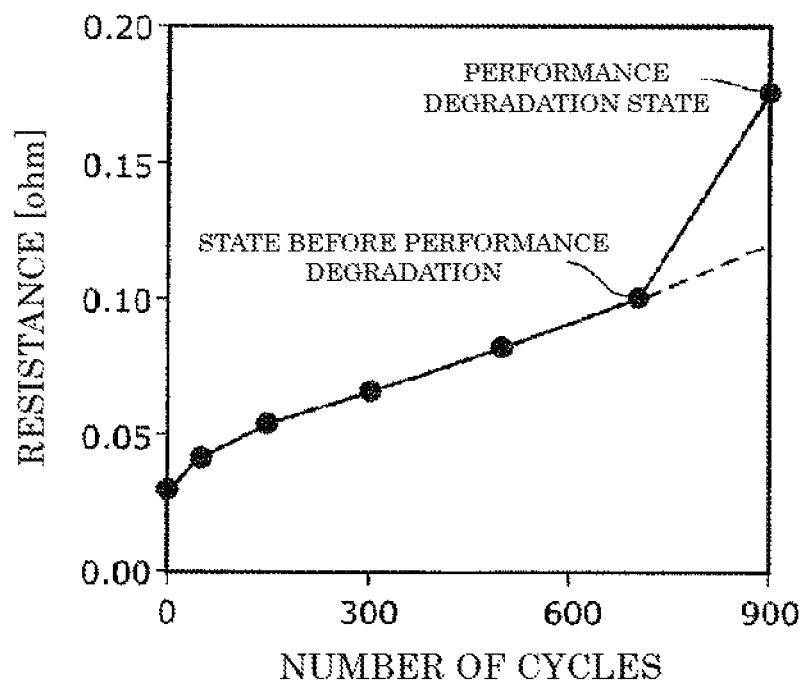
FIG. 11B is a diagram for explaining that the deterioration state of the energy storage device can be detected by the deterioration state detection apparatus according to the embodiment of the present invention.

FIG. 11A and FIG. 11B each is a diagram for explaining that the deterioration state of the energy storage devices 200 can be detected by the deterioration state detection apparatus 100 according to the embodiment of the present invention. Specifically, FIG. 11A is a graph illustrating a relation between the number of cycles in the charge-discharge cycle tests in FIG. 9A to FIG. 10B and the discharge capacity (reversible capacity) of the energy storage devices 200, and FIG. 11B is a graph illustrating a relation between the number of cycles and the resistance value (internal resistance) of the energy storage devices 200 in the charge-discharge cycle tests.

As illustrated in FIG. 11A, when the number of cycles is 700 cycles and the subsequent cycles, the discharge capacity (reversible capacity) of the energy storage devices 200 rapidly degrades. Herein, the above 700 cycles is the number of cycles where the determination unit 120 determined that the determination capacitance is smaller than the capacitance average value. That is, the determination unit 120 determines whether or not the determination capacitance is smaller than the capacitance average value, so that it can be previously determined whether or not the energy storage devices are in a state where the rapid degradation of the reversible capacity starts.

The state where the rapid degradation of the reversible capacity of the energy storage devices 200 starts means a state where the rapid performance degradation of the energy storage devices 200 starts. Therefore, the determination unit 120 previously determines whether or not the energy storage devices are in the state where the rapid degradation of the reversible capacity starts, from the change of the capacitance, so that the determination unit 120 can determine whether or not the energy storage devices 200 are in the state before performance degradation.

As illustrated in FIG. 11B, when the number of cycles is 700 cycles and the subsequent cycles, the resistance value (internal resistance) of the energy storage devices 200 rapidly rises. That is, the input-output performance of the energy storage devices 200 rapidly degrades. Herein, the above 700 cycles is the number of cycles where the determination unit 120 determined that the determination capacitance is smaller than the capacitance average value. That is, the determination unit 120 determines whether or not the determination capacitance is smaller than the capacitance average value, so that it can be previously determined whether or not the energy storage devices are in a state where the rapid degradation of the input-output performance starts.

The state where the rapid degradation of the input-output performance of the energy storage devices 200 starts means a state where the rapid performance degradation of the energy storage devices 200 starts. Therefore, the determination unit 120 previously determines whether or not the energy storage devices are in the state where the rapid degradation of the input-output performance starts, from the change of the capacitance, so that the determination unit 120 can determine whether or not the energy storage devices 200 are in the state before performance degradation.

Figure 12A:
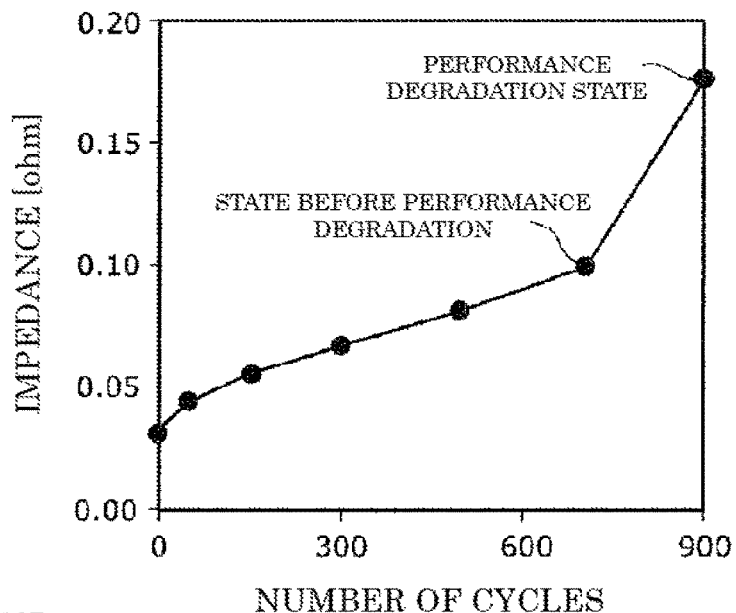
FIG. 12A is a diagram for explaining an effect produced by the deterioration state detection apparatus according to the embodiment of the present invention.
Figure 12B:
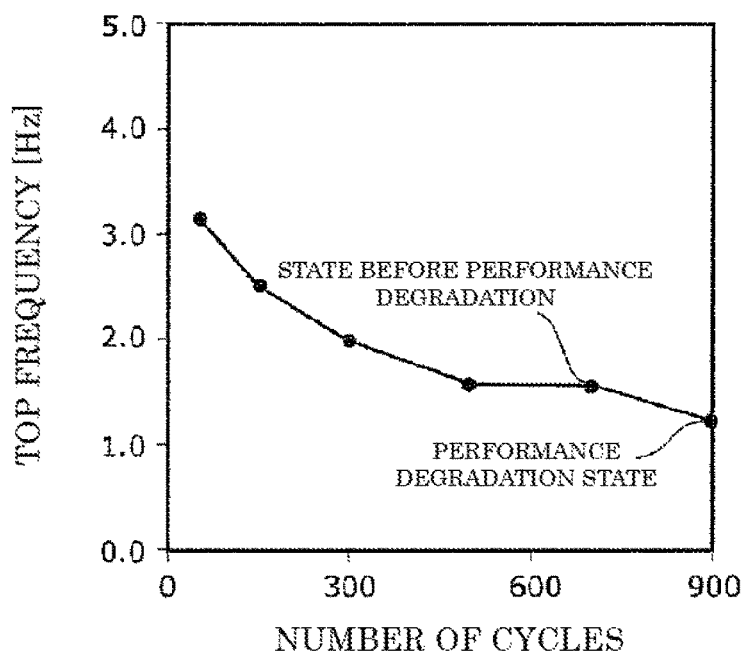
FIG. 12B is a diagram for explaining an effect produced by the deterioration state detection apparatus according to the embodiment of the present invention.

FIG. 12A and FIG. 12B each is a diagram for explaining an effect produced by the deterioration state detection apparatus 100 according to the embodiment of the present invention. Specifically, FIG. 12A is a graph illustrating a relation between the number of cycles and the impedance in the charge-discharge cycle tests in FIG. 9A to FIG. 10B, and FIG. 12B is a graph illustrating a relation between the number of cycles and the top frequency in the charge-discharge cycle tests.

As illustrated in FIG. 12A, from the relation between the number of cycles and the impedance, in a case where the number of cycles is 700 cycles, it is not possible to detect that the energy storage devices 200 are in the state before performance degradation. That is, from the change of the impedance, it is not possible to previously detect the rapid performance degradation of the energy storage devices 200.

Similarly, as illustrated in FIG. 12B, from the relation between the number of cycles and the top frequency, in a case where the number of cycles is 700 cycles, it is not possible to detect that the energy storage devices 200 are in the state before performance degradation. That is, from the change of the top frequency, it is not possible to previously detect the rapid performance degradation of the energy storage devices 200.

On the other hand, according to the deterioration state detection apparatus 100 according to the embodiment of the present invention, it is possible to previously detect the rapid performance degradation of the energy storage devices 200, from the change of the capacitance.

Thus, the deterioration state detection apparatus 100 according to the embodiment of the present invention determines the deterioration state of the energy storage devices 200 from the change of the capacitance of the energy storage devices 200. Herein, as a result of inventive studies and experiments, the inventors of the present application have found that it is possible to previously determine whether or not the rapid performance degradation of the energy storage devices 200 will be caused, from the change of the capacitance. Therefore, the deterioration state detection apparatus 100 can previously detect the rapid performance degradation of the energy storage devices 200.

As a result of inventive studies and experiments, the inventors of the present application have found that it is possible to previously determine whether or not the energy storage devices are in the state where the rapid degradation of the reversible capacity or the input-output performance starts, from the change of the capacitance. Then, the state where the rapid degradation of the reversible capacity or the input-output performance of the energy storage devices 200 starts means the state where the rapid performance degradation of the energy storage devices 200 starts. Therefore, the deterioration state detection apparatus 100 determines whether or not the energy storage devices are in the state where the rapid degradation of the reversible capacity or the input-output performance of the energy storage devices 200 starts, so that the deterioration state detection apparatus 100 can previously determine whether or not the rapid performance degradation of the energy storage devices 200 will be caused.

As a result of inventive studies and experiments, the inventors of the present application have found that it is determined whether or not the capacitance calculated at the predetermined determination time point is smaller than the reference value, so that it is possible to previously determine at the determination time point whether or not the rapid performance degradation of the energy storage devices 200 will be caused. Therefore, the deterioration state detection apparatus 100 can previously detect the rapid performance degradation of the energy storage devices 200.

As a result of inventive studies and experiments, the inventors of the present application have found that it is determined whether or not the determination capacitance is smaller than the value obtained by multiplying the average value of the capacitances calculated before the determination time point by a predetermined constant, so that it is possible to previously determine at the determination time point whether or not the rapid performance degradation of the energy storage devices 200 will be caused. Therefore, the deterioration state detection apparatus 100 can previously detect the rapid performance degradation of the energy storage devices 200.

As a result of inventive studies and experiments, the inventors of the present application have found that in a case where the determination capacitance is smaller than a value between 80% and 90% of the capacitance average value (85% in this embodiment), it is possible to determine that the energy storage devices are in a state that the rapid performance degradation of the energy storage devices 200 has not been caused. Therefore, the deterioration state detection apparatus 100 can previously detect the rapid performance degradation of the energy storage devices 200.

Additionally, the deterioration state detection apparatus 100 acquires the capacitances at the plurality of time points up to the determination time point, calculates the capacitance average value, thereby the deterioration state detection apparatus 100 previously determines at the determination time point whether or not the rapid performance degradation of the energy storage devices 200 will be caused. Consequently, the deterioration state detection apparatus 100 can easily previously detect the rapid performance degradation of the energy storage device 200.

As a result of inventive studies and experiments, the inventors of the present application have found that in a case where the top frequency is larger than the predetermined threshold value, even when the energy storage devices 200 do not deteriorate, the value of the capacitance becomes considerably small. Therefore, according to the deterioration state detection apparatus 100, the capacitance in a case where the top frequency is the predetermined threshold value or less is acquired, so that the rapid performance degradation of the energy storage devices 200 can be previously detected with high accuracy.

The deterioration state detection apparatus 100 calculates the capacitance based on the measurement using the complex impedance method. Consequently, the deterioration state detection apparatus 100 can acquire the capacitance to previously detect the rapid performance degradation of the energy storage devices 200 with high accuracy.

In a case where the deterioration state detection apparatus 100 previously determines the rapid performance degradation of the energy storage devices 200, the deterioration state detection apparatus 100 limits the charging upper limit voltage of the energy storage devices 200 or the energizing maximum current to the energy storage devices 200, so that the deterioration state detection apparatus 100 can suppress the rapid performance degradation of the energy storage devices 200, and extend life.

While the energy storage system 10 and the deterioration state detection apparatus 100 according to the embodiment of the present invention have been described above, the present invention is not limited to this embodiment. That is, it is clearly understood that the same is by way of illustration and example only and is not to be taken by way of limitation. The scope of the present invention is interpreted by the terms of the appended claims rather than the foregoing description, and all modification and change that come within the meaning and range of equivalency of the claims are intended to be embraced therein.

For example, in the above embodiment, the determination unit 120 compares the determination capacitance with the capacitance average value, so that the determination unit 120 determines whether or not the energy storage devices 200 are in the state before performance degradation. However, the determination unit 120 may compare the determination capacitance with a value of a past capacitance, for example, may compare the determination capacitance with a value of a capacitance at a last time point.

In the above embodiment, the acquisition unit 110 calculates and acquires the capacitance based on the measurement using the complex impedance method as an example. However, the acquisition unit 110 may acquire the capacitance from an external apparatus without using the complex impedance method.

In the above embodiment, the acquisition unit 110 acquires the capacitance in the case where the top frequency is the predetermined threshold value or less. However, the acquisition unit 110 may also acquire a capacitance in a case where the top frequency is larger than the predetermined threshold value. In this case, the determination unit 120 may perform determination without including the capacitance acquired by the acquisition unit 110. In a case where the determination unit 120 performs determination including the capacitance, it is possible to handle by changing a numerical value (85%) for determination, or the like.

In the above embodiment, the acquisition unit 110 acquires the capacitance of the energy storage devices 200 by the measurement using the LCR meter, or acquires the capacitance of the energy storage devices 200 by using the complex impedance method. However, the acquisition unit 110 may acquire the capacitance of the energy storage devices 200 by any method.

The present invention can be implemented not only as such an energy storage system 10 or such a deterioration state detection apparatus 100, but also as a deterioration state detection method employing characteristic processors included in the deterioration state detection apparatus 100, as steps.

Figure 13:
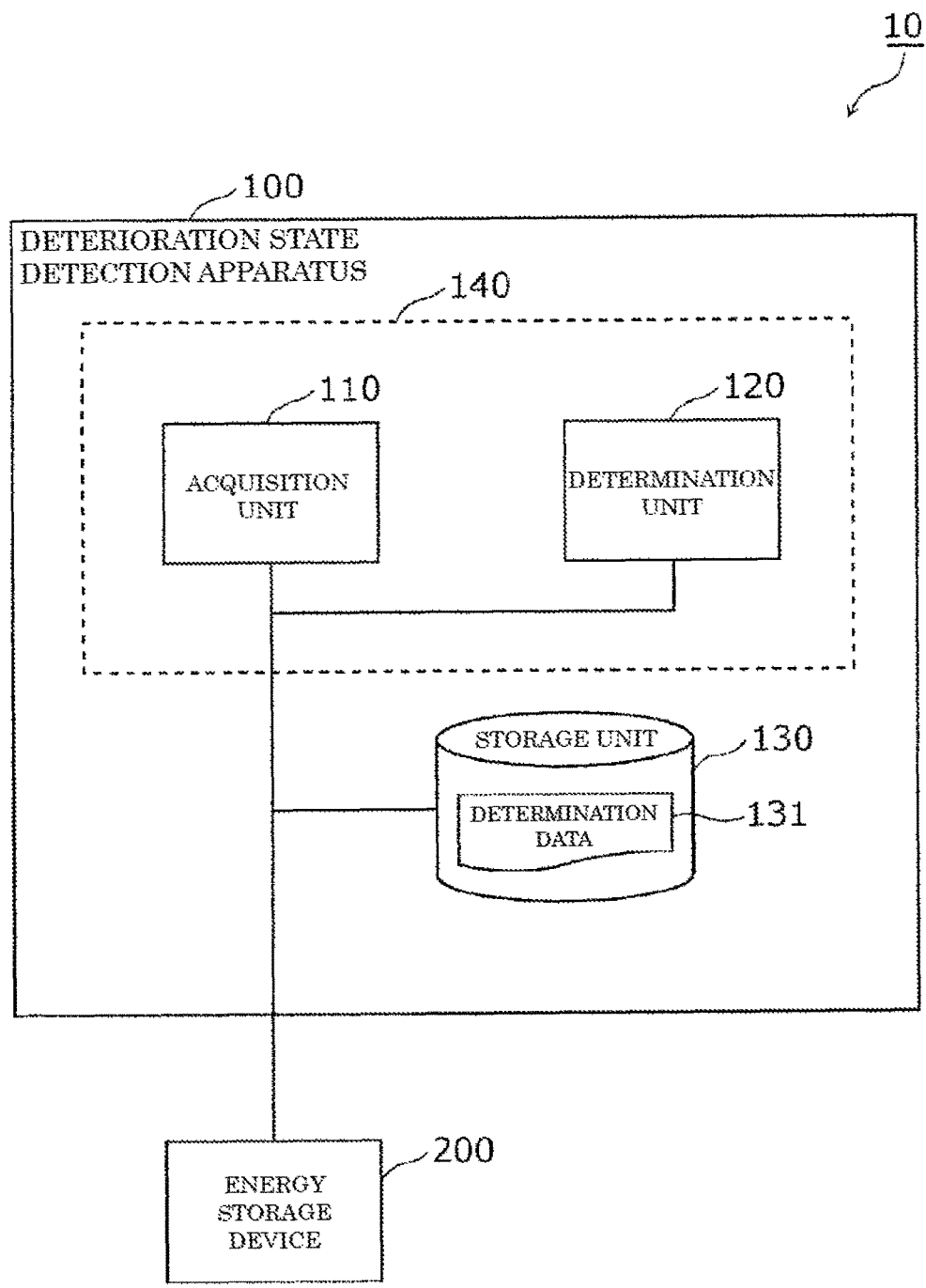
FIG. 13 is a block diagram illustrating a configuration implemented by an integrated circuit of the deterioration state detection apparatus according to the embodiment of the present invention.

Each processor included in the deterioration state detection apparatus 100 according to the present invention may implement as a LSI (Large Scale Integration) which is an integrated circuit. For example, as illustrated in FIG. 13, the present invention can be implemented as an integrated circuit 140 including the acquisition unit 110 and the determination unit 120. FIG. 13 is a block diagram illustrating a configuration in which the deterioration state detection apparatus 100 according to the embodiment of the present invention is implemented by the integrated circuit.

Each processor included in the integrated circuit 140 may be individually formed into a single chip, or may be formed into a single chip so as to include a part or all. Herein, the integrated circuit is referred to as a LSI, but sometimes referred to as an IC, a system LSI, a super LSI, or an ultra LSI depending on a difference in an integration degree.

The method for allowing an integrated circuit is not limited to the LSI, and may be implemented by a dedicated circuit or a general processor. After LSI production, a FPGA (Field Programmable Gate Array) capable of programming, or a reconfigurable processor capable of reconfiguring connection or setting of a circuit cell inside the LSI may be utilized.

Furthermore, when a technology enabling an integrated circuit by advanced technologies or derived other technologies, replaced by the LSI, appears, of course, a function block may be integrated by using the technology. There is a possibility of application of a biotechnology or the like.

The present invention can be implemented also as a program causing a computer to execute characteristic processes including the deterioration state detection method, or a computer readable non-transitory recording medium with the program recorded therein, such as a flexible disk, a hard disk, a CD-ROM, a MO, a DVD, a DVD-ROM, a DVD-RAM, a BD (Blu-ray (registered trademark) Disc), and a semiconductor memory. It goes without saying that such a program can be distributed through a transmission medium, for example, a recording medium such as a CD-ROM, the Internet, and the like.

INDUSTRIAL APPLICABILITY

The present invention is applicable to a deterioration state detection apparatus or the like that can previously detect rapid performance degradation in an energy storage device such as a lithium ion secondary battery.

DESCRIPTION OF REFERENCE SIGNS

10 Energy storage system
100 Deterioration state detection apparatus
110 Acquisition unit
120 Determination unit
130 Storage unit
131 Determination data
140 Integrated circuit
200 Energy storage device
300 Housing case

The invention claimed is:

1. A deterioration state detection apparatus for detecting a state before performance degradation, which is a state right before a rapid performance degradation of a nonaqueous electrolyte secondary battery, comprising:
   an acquisition unit that acquires a capacitance of the nonaqueous electrolyte secondary battery; and
   a determination unit that determines whether or not the nonaqueous electrolyte secondary battery is in the state before performance degradation as a deterioration state of capacity enabling charge or discharge of the nonaqueous electrolyte secondary battery, from change of the acquired capacitance,
   wherein the determination unit limits a charging upper limit voltage of the nonaqueous electrolyte secondary battery or an energizing maximum current to the nonaqueous electrolyte secondary battery based on a determination result of the deterioration state of capacity enabling charge or discharge of the nonaqueous electrolyte secondary battery.

2. The deterioration state detection apparatus according to claim 1,
wherein the determination unit determines whether or not a determination capacitance which is a capacitance calculated at a predetermined determination time point is smaller than a reference value, so that the determination unit determines the deterioration state of capacity enabling charge or discharge of the nonaqueous electrolyte secondary battery at the determination time point.

3. The deterioration state detection apparatus according to claim 2,
wherein the determination unit employs a value obtained by multiplying a capacitance average value being an average value of capacitances calculated before the determination time point by a predetermined constant, as the reference value, and determines whether or not the determination capacitance is smaller than the reference value, so that the determination unit determines the deterioration state of capacity enabling charge or discharge of the nonaqueous electrolyte secondary battery at the determination time point.

4. The deterioration state detection apparatus according to claim 3,
wherein the determination unit employs a value between 0.8 and 0.9 as the constant, and determines whether or not the determination capacitance is smaller than the reference value, so that the determination unit determines the deterioration state of capacity enabling charge or discharge of the nonaqueous electrolyte secondary battery at the determination time point.

5. The deterioration state detection apparatus according to claim 3,
wherein the acquisition unit acquires capacitances of the nonaqueous electrolyte secondary battery at a plurality of time points up to the determination time point, and the determination unit averages the plurality of capacitances acquired before the determination time point to calculate the capacitance average value, so that the determination unit determines the deterioration state of capacity enabling charge or discharge of the nonaqueous electrolyte secondary battery at the determination time point.

6. The deterioration state detection apparatus according to claim 1,
wherein the acquisition unit calculates the capacitance based on measurement using a complex impedance method, to acquire the capacitance.

7. The deterioration state detection apparatus according to claim 6,
wherein when a frequency at a point, where an imaginary axis component of an arc appearing when drawing a Nyquist diagram based on the measurement using the complex impedance method is a maximum value, is defined as a top frequency, the acquisition unit acquires the capacitance in a case where the top frequency is a predetermined threshold value or less.

8. The deterioration state detection apparatus according to claim 7, wherein the acquisition unit does not acquire the capacitance in a case where the top frequency is larger than the predetermined threshold value.

9. The deterioration state detection apparatus according to claim 7, wherein the determination unit determines the deterioration state of capacity enabling charge or discharge of the nonaqueous electrolyte secondary battery without including the capacitance acquired in a case where the top frequency is larger than the predetermined threshold value.

10. The deterioration state detection apparatus according to claim 1,
wherein the capacitance, an impedance R, and a top frequency f satisfy a relational expression of capacitance $C=1/(2\pi fR)$,
the impedance R is equivalent to the width of the real axis impedance in an arc represented in a Nyquist diagram based on a data row formed by combining a frequency, a real axis impedance, and an imaginary axis impedance, the data row being acquired by measurement using the complex impedance method,
the top frequency f is equivalent to a frequency at a point where an imaginary axis impedance is a maximum value in the arc.

11. An energy storage system comprising:
a nonaqueous electrolyte secondary battery; and
a deterioration state detection apparatus according to claim 1, wherein the deterioration state detection apparatus detects the state before performance degradation, which is the state right before a rapid performance degradation of the nonaqueous electrolyte secondary battery.

12. A deterioration state detection method for detecting, by using a computer, a state before performance degradation, which is a state right before a rapid performance degradation of a nonaqueous electrolyte secondary battery, comprising:
an acquiring step of acquiring a capacitance of the nonaqueous electrolyte secondary battery;
a determining step of determining whether or not the nonaqueous electrolyte secondary battery is in the state before performance degradation as a deterioration state of capacity enabling charge or discharge of the nonaqueous electrolyte secondary battery, from change of the acquired capacitance; and
a limiting step of limiting a charging upper limit voltage of the nonaqueous electrolyte secondary battery or an energizing maximum current to the nonaqueous electrolyte secondary battery based on a determination result of the deterioration state of capacity enabling charge or discharge of the nonaqueous electrolyte secondary battery.

13. An integrated circuit for detecting a state before performance degradation, which is a state right before a rapid performance degradation of a nonaqueous electrolyte secondary battery, comprising:
an acquisition unit that acquires a capacitance of the nonaqueous electrolyte secondary battery; and
a determination unit that determines whether or not the nonaqueous electrolyte secondary battery is in the state before performance degradation as a deterioration state of capacity enabling charge or discharge of the nonaqueous electrolyte secondary battery, from change of the acquired capacitance,
wherein the determination unit limits a charging upper limit voltage of the nonaqueous electrolyte secondary battery or an energizing maximum current to the nonaqueous electrolyte secondary battery based on a determination result of the deterioration state of capacity enabling charge or discharge of the nonaqueous electrolyte secondary battery.

* * * * *